US010901661B2

(12) United States Patent
Amidi et al.

(10) Patent No.: US 10,901,661 B2
(45) Date of Patent: *Jan. 26, 2021

(54) APPARATUS, SYSTEM, AND METHOD OF BYTE ADDRESSABLE AND BLOCK ADDRESSABLE STORAGE AND RETRIEVAL OF DATA TO AND FROM NON-VOLATILE STORAGE MEMORY

(71) Applicant: Xitore, Inc., Mission Viejo, CA (US)

(72) Inventors: Mike Hossein Amidi, Lake Forest, CA (US); Fariborz Frankie Roohparvar, Monte Sereno, CA (US)

(73) Assignee: Xitore, Inc., Lake Forest, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 16/264,187

(22) Filed: Jan. 31, 2019

(65) Prior Publication Data

US 2019/0163375 A1 May 30, 2019

Related U.S. Application Data

(60) Continuation of application No. 15/717,762, filed on Sep. 27, 2017, now Pat. No. 10,235,103, which is a
(Continued)

(51) Int. Cl.
*G06F 3/06* (2006.01)
*G11C 16/26* (2006.01)
(Continued)

(52) U.S. Cl.
CPC ............ *G06F 3/068* (2013.01); *G06F 3/0604* (2013.01); *G06F 3/0605* (2013.01); *G06F 3/0619* (2013.01); *G06F 3/0635* (2013.01);
*G06F 3/0655* (2013.01); *G06F 3/0659* (2013.01); *G06F 3/0661* (2013.01); *G06F 3/0673* (2013.01); *G06F 3/0679* (2013.01); *G06F 9/30* (2013.01); *G06F 11/10* (2013.01); *G06F 11/1004* (2013.01); *G06F 11/1068* (2013.01);
(Continued)

(58) Field of Classification Search
CPC ........ G06F 3/068; G06F 3/0604; G11C 16/26
See application file for complete search history.

(56) References Cited

U.S. PATENT DOCUMENTS 3,740,723 A * 6/1973 Beausoleil .......... G06F 12/0864
711/117
3,840,863 A * 10/1974 Fuqua ................. G06F 12/0864
711/3
(Continued)

*Primary Examiner* — Joseph D Torres
(74) *Attorney, Agent, or Firm* — Fish IP Law, LLP

(57) ABSTRACT

A hybrid memory system provides rapid, persistent byte-addressable and block-addressable memory access to a host computer system by providing direct access to a both a volatile byte-addressable memory and a volatile block-addressable memory via the same parallel memory interface. The hybrid memory system also has at least a non-volatile block-addressable memory that allows the system to persist data even through a power-loss state. The hybrid memory system can copy and move data between any of the memories using local memory controllers to free up host system resources for other tasks.

17 Claims, 4 Drawing Sheets

Related U.S. Application Data continuation-in-part of application No. 15/426,886, filed on Feb. 7, 2017, now Pat. No. 10,048,962, which is a continuation-in-part of application No. 15/144,653, filed on May 2, 2016, now Pat. No. 9,569,209, which is a division of application No. 14/559,776, filed on Dec. 3, 2014, now Pat. No. 9,354,872.

(60) Provisional application No. 61/983,944, filed on Apr. 24, 2014, provisional application No. 62/400,559, filed on Sep. 27, 2016.

(51) Int. Cl.

| | | |
|---|---|---|
| *G06F 9/30* | (2018.01) | |
| *G06F 12/06* | (2006.01) | |
| *G06F 12/02* | (2006.01) | |
| *G06F 12/0888* | (2016.01) | |
| *G06F 11/10* | (2006.01) | |
| *G06F 12/0802* | (2016.01) | |
| *G11C 29/52* | (2006.01) | |
| *G06F 12/10* | (2016.01) | |
| *G06F 13/00* | (2006.01) | |
| *G11C 29/04* | (2006.01) | |
| *G11C 8/06* | (2006.01) | |

(52) U.S. Cl.
CPC ...... *G06F 12/0223* (2013.01); *G06F 12/0246* (2013.01); *G06F 12/06* (2013.01); *G06F 12/0638* (2013.01); *G06F 12/0802* (2013.01); *G06F 12/0888* (2013.01); *G06F 12/10* (2013.01); *G06F 13/00* (2013.01); *G11C 16/26* (2013.01); *G11C 29/52* (2013.01); *G06F 2206/1014* (2013.01); *G06F 2212/152* (2013.01); *G06F 2212/205* (2013.01); *G06F 2212/261* (2013.01); *G06F 2212/401* (2013.01); *G06F 2212/403* (2013.01); *G11C 8/06* (2013.01); *G11C 2029/0411* (2013.01)

(56) References Cited

U.S. PATENT DOCUMENTS

| | | | |
|---|---|---|---|
| 6,480,021 B2 | 11/2002 | Deas | |
| 6,820,234 B2 | 11/2004 | Deas | |
| 6,850,438 B2 | 2/2005 | Lee et al. | |
| 7,107,386 B1 | 9/2006 | Purcell | |
| 7,278,069 B2 | 10/2007 | Abrosimov | |
| 7,426,603 B2 | 9/2008 | Purcell | |
| 9,208,071 B2 | 12/2015 | Talagala et al. | |
| 9,378,142 B2 | 6/2016 | Ramanujan | |
| 10,133,667 B2* | 11/2018 | Mukherjee | G06F 12/08 |
| 2003/0046447 A1* | 3/2003 | Kouperchliak | G06F 9/4415 719/321 |
| 2005/0204092 A1* | 9/2005 | Masuyama | G06F 12/0623 711/103 |
| 2007/0033374 A1* | 2/2007 | Sinclair | G06F 12/0246 711/203 |
| 2009/0203430 A1* | 8/2009 | Peek | G07F 17/32 463/25 |
| 2010/0107004 A1* | 4/2010 | Bottelli | G11C 29/802 714/6.12 |
| 2013/0304980 A1 | 11/2013 | Nachimuthu et al. | |
| 2014/0189201 A1* | 7/2014 | Dhakshinamurthy | G06F 13/1684 711/103 |
| 2018/0067853 A1* | 3/2018 | Mukherjee | G06F 3/0604 |
| 2018/0173419 A1* | 6/2018 | Dubeyko | G06F 3/0685 |

\* cited by examiner

APPARATUS, SYSTEM, AND METHOD OF BYTE ADDRESSABLE AND BLOCK ADDRESSABLE STORAGE AND RETRIEVAL OF DATA TO AND FROM NON-VOLATILE STORAGE MEMORY

This application is a continuation of U.S. patent application Ser. No. 15/717,762 filed on Sep. 27, 2017, which is a continuation-in-part of U.S. patent application Ser. No. 15/426,886 filed on Feb. 7, 2017, now issued U.S. Pat. No. 10,048,962, which is a continuation-in-part of U.S. patent application Ser. No. 15/144,653 filed on May 2, 2016, now issued U.S. Pat. No. 9,569,209, which is a divisional of U.S. patent application Ser. No. 14/559,776, filed on Dec. 3, 2014, now issued U.S. Pat. No. 9,354,872, which claims priority to U.S. Provisional Patent Application No. 61/983,944, filed on Apr. 24, 2014. This application also claims the benefit of priority to U.S. Provisional Application No. 62/400,559, filed on Sep. 27, 2016. These and all other extrinsic references referenced herein are incorporated by reference in their entirety.

FIELD OF THE INVENTION

The field of the invention is memory storage devices.

BACKGROUND

The background description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Data saved on memory can be accessed via a byte-addressable means, which allows for rapid access with an optimized memory space but more processing power. Memory can also be accessed via a block-addressable means, which allows for rapid access with less processing power but a non-optimized memory space. Since non-volatile memory tends to be slower than volatile memory, non-volatile memory is traditionally accessed via only block-addressable means.

U.S. Pat. No. 6,850,438 to Lee teaches a combination EEPROM and Flash memory in one chip. Lee's Flash memory is block-erasable and stores data having less frequent update rates while the EEPROM memory is byte-erasable and stores data with a high update frequency rate, allowing data to be written to the EEPROM while the data is read from the Flash memory simultaneously. Lee's chip, however, fails to utilize the rapid speeds of volatile memory, which prevents its chip from being used in ultra-high-speed embodiments. In addition, Lee's system only allows data to be transferred to/from each memory, and does not allow data to be rapidly transmitted from one memory to another directly within Lee's chip itself.

U.S. Pat. No. 9,208,071 to Talagala teaches a volatile, natively byte-addressable auto-commit memory that writes the contents of the byte-addressable volatile memory media to non-byte-addressable memory media of the auto-commit memory in response to a trigger event. Talagala's system, however, utilizes a traditional system bus to commit data from the volatile memory buffer to the non-volatile backing media, which requires OS drivers to be written and utilized for transmitting data from Talagala's volatile byte-addressable memory to its non-volatile block-addressable memory.

Thus, there remains a need for a system and method to rapidly utilize both block-addressable and byte-addressable means within a single memory solution.

SUMMARY OF THE INVENTION

The following description includes information that may be useful in understanding the present invention. It is not an admission that any of the information provided herein is prior art or relevant to the presently claimed invention, or that any publication specifically or implicitly referenced is prior art.

The inventive subject matter provides apparatus, systems, and methods in which a hybrid memory system provides rapid, persistent byte-addressable and block-addressable memory access.

The hybrid memory system preferably interfaces with a host system via a host PMI (Parallel Memory Interface) that directly couples to a host system bus, such as a DIMM slot on a computer motherboard. Since the hybrid memory system provides the dual functionality of a byte-addressable and a block-addressable solution, the hybrid memory system could appear to the host system as a first segment of a volatile byte-addressable memory, such as a standard DRAM, and a non-volatile block-addressable memory, such as an SSD array.

The host PMI generally receives commands and controls that are forwarded to a traffic controller to handle data traffic with the host PMI. The commands could include, for example, read access and write access commands. The controls preferably identify the memory location that the host logical access refers to. In some embodiments, the controls could be a simple flag that identifies whether the memory is a byte-addressable memory or a block-addressable memory. In other embodiments, the controls could be a pair of flags, a first of which identifies whether the memory is byte-addressable or block-addressable, and a second of which identifies whether the memory is volatile or non-volatile. In still other embodiments, the controls could identify specific memory array locations, and could act as part of a memory address identifier.

The memory system comprises at least a volatile memory logically divided into a volatile byte-addressable memory and a volatile block-addressable memory, and a non-volatile block addressable memory. In some embodiments, the non-volatile memory could also be logically divided into a non-volatile byte-addressable memory and a non-volatile block-addressable memory. Each memory partition preferably comprises an array of memory devices that are separately addressable via a physical memory address, and preferably forms a single, addressable minimum data width for host read and write operations.

The traffic controller locally manages both incoming and outgoing host data traffic as a function of a received host address. As used herein, a "locally managed" traffic controller routes traffic between a memory of the hybrid memory system and the host PMI, and/or between the various memories of the hybrid memory system without traveling through the host PMI. The traffic controller responds to incoming commands and controls routed from the host PMI and routes data accordingly. For example, the traffic controller could route data between the volatile byte-addressable memory and the volatile block-addressable memory and route data between the volatile block-addressable memory and the non-volatile block addressable memory. Preferably, the traffic controller persists at least the data saved to the volatile block-addressable memory to the non-volatile block-addressable memory, and in some embodiments also persists data saved to the volatile byte-addressable memory to the non-volatile block-addressable memory (preferably via first saving the data to the volatile block-addressable memory).

An address translation circuit is also preferably provided that translates a logical host address to a physical address when the host address refers to a block-addressable address. In embodiments where the host address refers to a byte-addressable address, the host address is preferably already a physical address and merely needs to be forwarded to the volatile byte-addres sable memory to identify the memory that the command refers to.

The hybrid memory system preferably also has two local memory controllers: a volatile memory controller that controls data traffic with the volatile block-addressable memory and a non-volatile memory controller that controls data traffic with the non-volatile memory. Since the local memory controller is utilized to control data traffic, data could be simultaneously read from one memory and written to another memory using the traffic controller and the memory controller.

Various objects, features, aspects and advantages of the inventive subject matter will become more apparent from the following detailed description of preferred embodiments, along with the accompanying drawing figures in which like numerals represent like components.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

DETAILED DESCRIPTION

Figure 1:
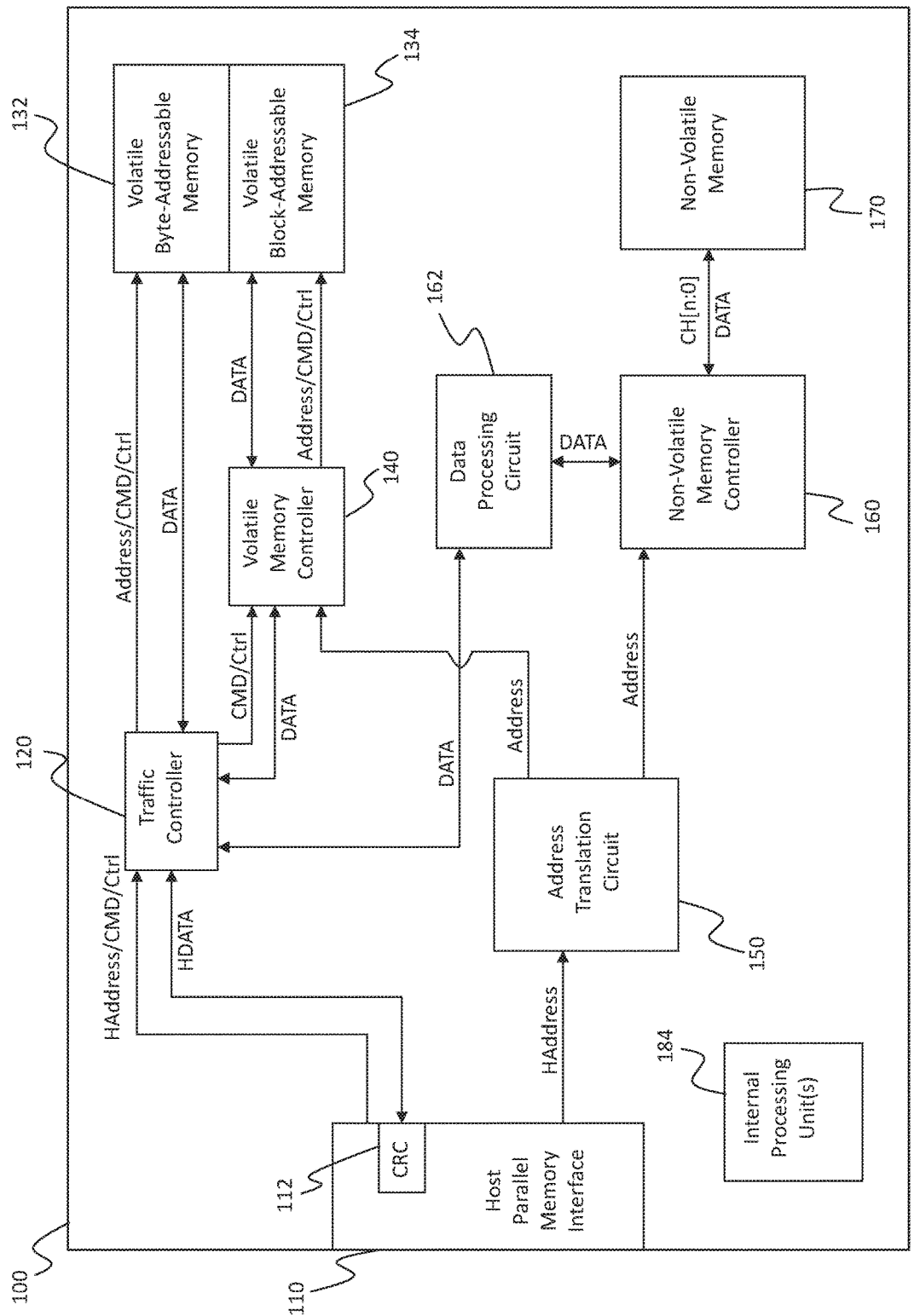
FIG. 1 is a hardware schematic of a contemplated hybrid memory system

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. Electronic devices that are "functionally coupled to" one another are coupled to one another in such a manner to allow for electronic data to be transmitted between the electronic devices.

Unless the context dictates the contrary, all ranges set forth herein should be interpreted as being inclusive of their endpoints, and open-ended ranges should be interpreted to include commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be noted that any language directed to a computer system should be read to include any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Computer software that is "programmed" with instructions is developed, compiled, and saved to a computer-readable non-transitory medium specifically to accomplish the tasks and functions set forth by the disclosure when executed by a computer processor.

FIG. 1 shows a hybrid memory apparatus 100 with a host parallel memory interface 110, a CRC (Cyclic Redundancy Check) circuit 112, a traffic controller 120, a volatile byte-addressable memory 132, a volatile block-addressable memory 134, a volatile memory controller 140, an address translation circuit 150, a data processing circuit 162, a non-volatile memory controller 160, a non-volatile memory 170, and an internal processing unit(s) 184.

The host computer system (not shown) preferably communicates with Host PMI 110 via a storage device driver installed on the host computer system (e.g. OS driver software). For example, the storage device driver could be programmed to allow hybrid memory apparatus 100 to be seen as both a volatile byte-addressable memory (e.g. DRAM, MRAM) and as a local cache for a non-volatile block-addressable memory (e.g. SSD cache, SSD buffer) (and hence a cache to a non-volatile SCM) to host applications, and controls queuing capabilities, out of order execution capabilities, commands, and responses of the controller to status queries to the host application.

Internal processing unit(s) 184 comprises any suitable processing unit capable of executing the functionality described herein. In some embodiments, internal processing unit(s) 184 comprises at least one off the shelf CPUs that is/are embedded into hybrid memory apparatus 100 to manage host PMI 110, volatile memory controller 140, non-volatile memory controller 160, and other internal blocks via internal firmware executed by internal processing unit(s) 184. The executed firmware could also manipulate incoming host data from host PMI 110 and perform in-controller computations on local data within the memories of hybrid memory apparatus 100. While not shown in the drawing for reasons of complexity, internal processing unit (s) 184 preferably has control lines connected to each block of hybrid memory apparatus 100, and at least has control lines connected to host PMI 110, traffic controller 120, volatile memory controller 140, data processing circuit 162, and non-volatile memory controller 160. Internal processing unit(s) 184 also preferably receives the command and control signals from host PMI 110.

Host PMI 110 functionally couples to a host system bus (not shown) to enable data communication between hybrid memory apparatus 100 and a host computer system (not shown). Host PMI preferably directly couples to the host system bus through any suitable electrical coupling, such as a DIMM slot, a SIMM slot, a SDRAM slot, a DRAM slot, a DDR slot, an SCM (Storage Class Memory) slot (e.g. SSD array), an ATI coupling, and a SCSI coupling.

Host PMI receives host commands, host addresses, and host controls from the host system bus and sometimes transmits host data to/from the host system bus. Contemplated commands include writes to volatile byte-addressable memory 132, writes to the volatile block-addressable memory 134, writes to the non-volatile memory 170, reads from volatile byte-addressable memory 132, reads from the volatile block-addressable memory 134, reads from the non-volatile memory 170, and copies between any of volatile byte-addressable memory 132, volatile block-addressable memory 134, and non-volatile memory 170. Commands to copy data from a byte-addressable memory to a block-addressable memory are typically handled by traffic controller 120 by padding the destination block with empty or null data to fill the block with data. Commands to copy data from a block-addressable memory to a byte-addressable memory are typically handled by traffic controller 120 by ignoring any empty or null data when copying from a source to a destination.

Host PMI 110 routes the received host address to either traffic controller 120 or to address translation circuit 150 depending upon whether the host address refers to a byte-addressable address or the host address refers to a block-addressable address. A host address comprising a byte-addressable address preferably comprises a physical byte address that can be forwarded directly to traffic controller 120, which then forwards the physical byte address to volatile byte-addressable memory 132 to identify the volatile byte-addressable memory that is written to or read from. While the host address referring to a byte-addressable memory is preferably a physical address, the host address could be a logical address that is translated by traffic controller 120 or by another address translation circuit (not shown) in some embodiments.

A host address comprising a block-addressable address comprises a logical address that is forwarded to address translation circuit 150, which translates the logical address into a physical block address for an address block. This physical block address can then be forwarded either to volatile memory controller 140 to access volatile block-addressable memory 134 or to non-volatile memory controller 160 to access non-volatile memory 170. While the host address referring to a block-addressable memory is preferably a logical address, the host address could be a physical address that need not be translated by address translation circuit 150 in some embodiments.

CRC 112 is programmed to add additional information to the incoming host data that is sent to traffic controller 120 and checks the internal data going back from traffic controller 120 to host PMI 110 against previously generated CRC checks for proper data transmission and error checking. In preferred embodiments, the CRC data added to incoming host data is added to the host data before the incoming host data is sent to traffic controller 120.

Host PMI 110 could determine whether the received host address refers to a byte-addressable address or to a block-addressable address in any suitable manner, for example by identifying a header of the host address, but preferably makes this determination by analyzing the control signal received from the host system bus. The control signal could comprise any number of bits, for example a first bit with a first setting that identifies the host address as a byte address and a second setting that identifies the host address as a block address, a second bit with a first setting that identifies the memory as a volatile memory and a second setting that identifies the memory as a non-volatile memory, and so on and so forth. The control lines could also identify to the system which set of volatile memories an incoming command should be applied to. Preferably, the control signal will separately turn on or off a rank of a memory array to properly identify the memory array that needs to be accessed by the incoming command.

Host PMI 110 could have a set of command lines that dictate the operation being requested (e.g. write, read) by the host computer system. These command lines are forwarded to traffic controller 120, which handles all data traffic in hybrid memory apparatus 100, and forwards command signals and control signals accordingly. In some embodiments, traffic controller 120 merely forwards the command signals and control signals, while in other embodiments traffic controller 120 translates the command signals and control signals before forwarding. Traffic controller 120 preferably allows data traffic to flow through it in multiple directions simultaneously, for example by allowing a read from block-addressable memory 134 through traffic controller 120 to non-volatile memory 170 simultaneously as a write from host PMI 110 to volatile byte-addressable memory 132. Such simultaneous data transfers can optimize use of data lines within hybrid memory apparatus 100 and drastically speed up operations.

Volatile byte-addressable memory could be any suitable volatile byte-addressable storage media, but is preferably a volatile byte-addressable storage array that is selectable via control lines from traffic controller 120. Volatile block-addressable memory could be any suitable volatile block-addressable storage media, but is preferably a volatile block-addressable storage array that is selectable via control lines from traffic controller 120 (via volatile memory controller 140). Non-volatile memory 170 could be any suitable non-volatile memory of any kind (or kinds), but is preferably a non-volatile block-addressable memory array that is selectable via control lines from traffic controller 120 (via non-volatile memory controller 160).

Volatile memory controller 140 is programmed to control traffic to/from volatile block-addressable memory 134 while non-volatile memory controller 160 is programmed to control traffic to/from non-volatile memory 170. Having memory controllers local to hybrid storage apparatus 100 that are not located on the host computer system allows data to be rapidly copied, moved, or otherwise transferred between the various memories of hybrid memory apparatus 100 without needing to offload the data to the host system bus via host PMI 110.

Data processing circuit 162 performs standard data processing tasks necessary for persisting data onto non-volatile memory 170, such as applying a security algorithm to the data, applying block compression and decompression algorithm to the data, applying an error correction algorithm to the data, or applying a data scrambling algorithm to the data.

Preferably, traffic controller 120 is programmed to only allow the host PMI to directly access volatile byte-addressable memory 132 or volatile block-addressable memory 134, and does not allow the host PMI to directly access data from non-volatile memory 170. When host PMI requests data that is located in non-volatile memory 170, and is not located in either volatile byte-addressable memory 132 or in volatile block-addressable memory 134, traffic controller 120 preferably copies data from non-volatile memory 170 to the appropriate volatile memory location for access by host PMI 110. Such an infrastructure allows hybrid memory apparatus 100 to appear to be a persistent, non-volatile byte-addressable and block-addressable memory to host PMI 110, while providing the rapid memory access abilities of volatile memory. Traffic controller 120 could be implemented using any suitable multiplexer, demultiplexer, digital logic, cross-bar, synchronous state machine, asynchronous state machine, microprocessor, or microcontroller with specific firmware to perform the aforementioned operations.

Figure 2A:
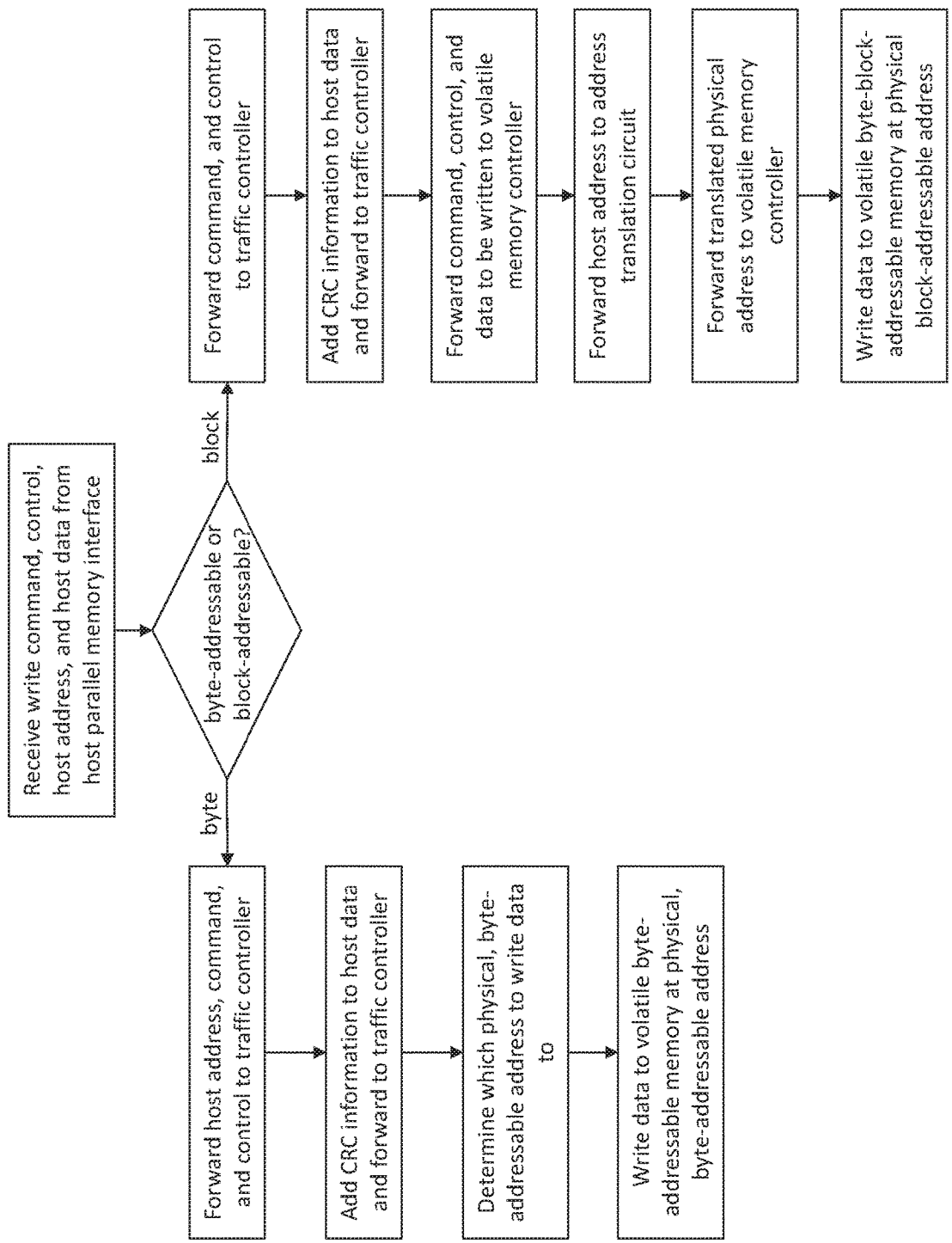
FIGS. 2A-2C show flowcharts of logic for a contemplated hybrid memory system of FIG. 1.
Figure 2B:
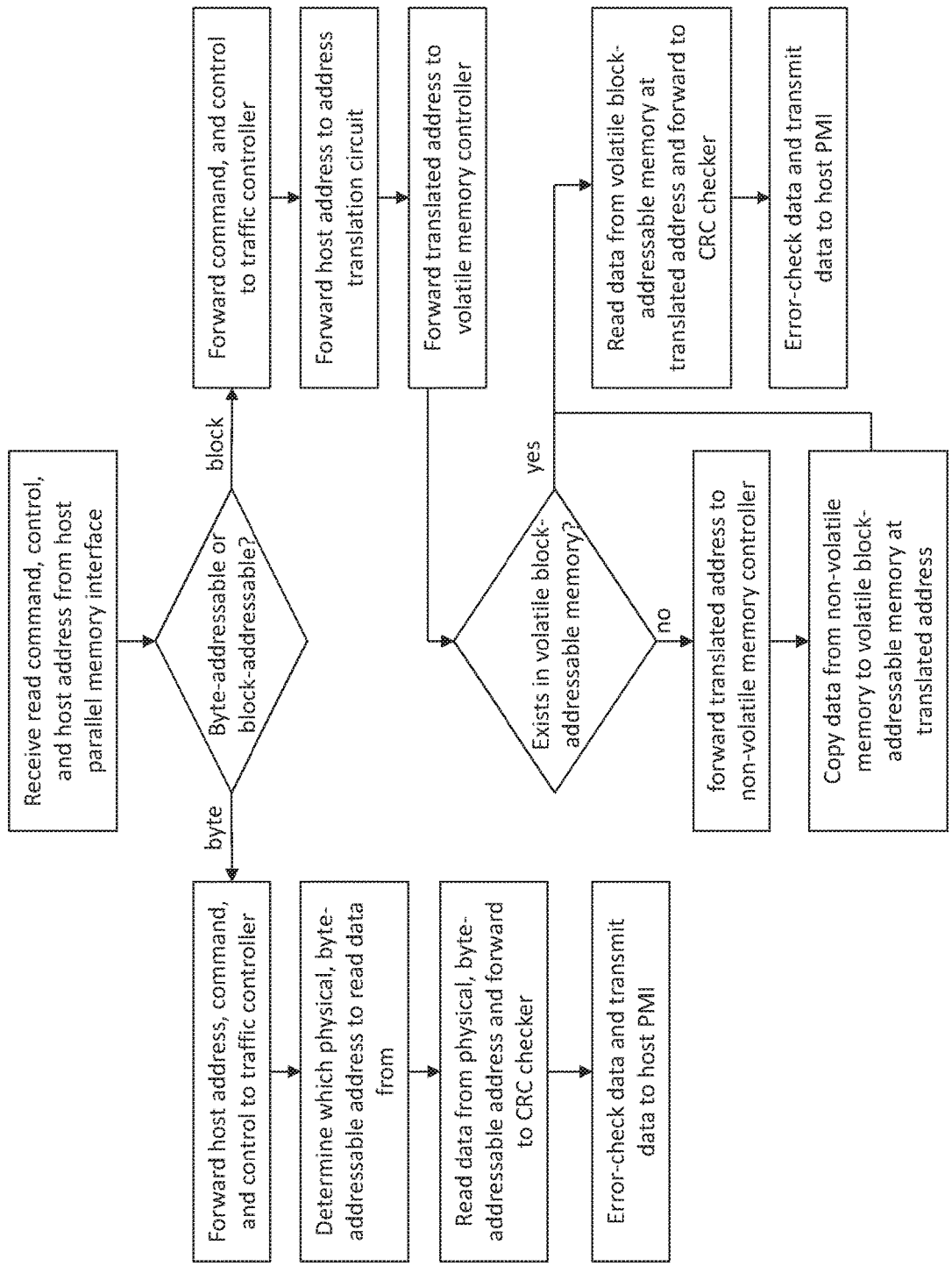
Figure 2C:
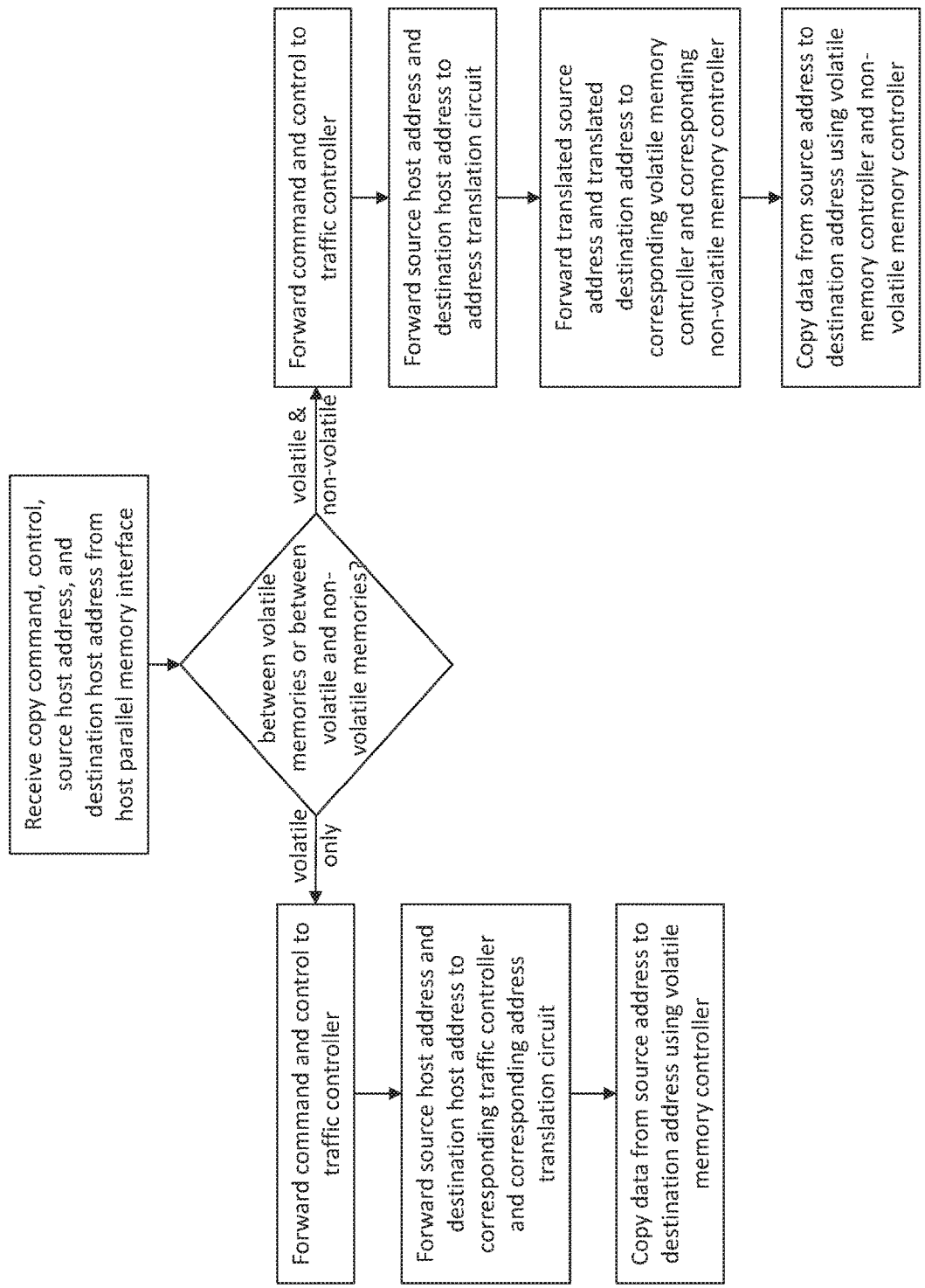

FIG. 2A shows an exemplary flowchart for a hybrid memory system to follow when it receives a write command from a host. FIG. 2B shows an exemplary flowchart for a hybrid memory system to follow when it receives a read command from a host. FIG. 2C shows an exemplary flowchart for a hybrid memory system to follow when it receives a copy command from a host.

As used herein, addresses that are forwarded to "corresponding" devices will be determined by which address is the host address and which address is the destination address. For example, a command to copy data from a volatile byte-addressable memory to a volatile block-addressable memory will necessitate the host source address to be forwarded to the traffic controller and the host destination address to be forwarded to the address translation circuit. On the other hand, a command to copy data from a volatile block-addressable memory to a volatile byte-addressable memory will necessitate the host source address to be forwarded to the address translation circuit and the host destination address to be forwarded to the traffic controller. Likewise, a command to copy data from a volatile block-addressable memory to a non-volatile block-addressable memory will necessitate the translated source address to be forwarded to the volatile memory controller and the translated destination address to be forwarded to the non-volatile memory controller. On the other hand, a command to copy data from a non-volatile block-addressable memory to a volatile block-addressable memory will necessitate the translated source address to be forwarded to the non-volatile memory controller and the translated destination address to be forwarded to the volatile memory controller.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A hybrid memory apparatus, comprising:
   a volatile memory logically divided into a volatile byte-addressable memory and a volatile block-addressable memory;
   a non-volatile block-addressable memory;
   a storage device driver;
   a host parallel memory interface that communicates at least a first command from the storage device driver to a host system bus to exchange data between each of:
      (a) the host system bus and the volatile byte-addressable memory,
      (b) the host system bus and the volatile block-addressable memory,
      (c) the volatile byte-addressable memory and the volatile block-addressable memory; and;
   a traffic controller that manages data traffic as a function of a host address received by the host parallel memory interface;
   an internal processing unit;
   wherein the internal processing unit is configured to manipulate at least the data exchanged from the host parallel memory interface.

2. The hybrid memory apparatus of claim 1, wherein the host parallel memory interface communicates at least the first command directly to the host system bus.

3. The hybrid memory apparatus of claim 1, wherein the internal processing unit comprises at least one of a Central Processing Unit, a microcontroller, and a microprocessor.

4. The hybrid memory apparatus of claim 1, further comprising:
   presenting the volatile byte-addressable memory as at least one of a DRAM array, MRAM array, an SRAM array, and an FeRAM array;
   presenting the volatile block-addressable memory as at least one of an SSD cache and an SSD buffer; and
   presenting the non-volatile block-addressable memory as at least one of an SSD array and an SCM array.

5. The hybrid memory apparatus of claim 1, wherein the internal processing unit is configured to perform computations on the data exchanged between the volatile memory and non-volatile block-addressable memory.

6. The hybrid memory apparatus of claim 1, the host parallel memory interface communicates at least a second command from the storage device driver to a host system bus.

7. The hybrid memory apparatus of claim 1, wherein the first command is at least one of a single command, a compound command, a queuing command, an out-of-order execution command, and a virtualization command.

8. The hybrid memory apparatus of claim 1, wherein the host parallel memory interface communicates the first command with at least one of data compression, data scrambling, a cyclic redundancy check, and an error-checking code.

9. The hybrid memory apparatus of claim 1, wherein the host parallel memory interface routes the host address to the traffic controller when the host address refers to a byte-addressable address and routes the host address to an address translation circuit when the host address refers to a block-addressable address.

10. The hybrid memory apparatus of claim 9, wherein the address translation circuit routes a translated host address to a local memory controller when the host address refers to a block-addressable address, and wherein the local memory controller routes the translated host address to the volatile block-addressable memory as a physical block-addressable address when the host address refers to a block-addressable address.

11. The hybrid memory apparatus of claim 1, wherein the traffic controller routes the host address to the volatile byte-addressable memory as a physical byte-addressable address when the host address refers to a byte-addressable address.

12. The hybrid memory apparatus of claim 1, wherein the traffic controller manages incoming commands and controls forwarded from the host parallel memory interface.

13. The hybrid memory apparatus of claim 1, wherein the traffic controller routes data between the volatile byte-addressable memory and the block-addressable memory without traveling through the host system interface.

14. The hybrid memory apparatus of claim 1, further comprising a volatile memory controller that controls data traffic with the volatile block-addressable memory.

15. The hybrid memory apparatus of claim 1, wherein the traffic controller routes data between the volatile block-addressable memory and the non-volatile block addressable memory without traveling through the host parallel memory interface.

16. The hybrid memory apparatus of claim 1, wherein the traffic controller is programmed to simultaneously write a first set of data to the volatile byte-addressable memory and read a second set of data from the block-addressable memory array.

17. The hybrid memory apparatus of claim 1, wherein the host system interface presents the volatile byte-addressable memory as a host accessible volatile memory block to the host system bus and presents the volatile block-addressable memory as a non-volatile storage memory to the host system bus.

\* \* \* \* \*